US00RE43366E

(19) United States
(12) Reissued Patent
Phommachanh

(10) Patent Number: US RE43,366 E
(45) Date of Reissued Patent: May 8, 2012

(54) JACK INCLUDING CROSSTALK COMPENSATION FOR PRINTED CIRCUIT BOARD

(75) Inventor: Chansy Phommachanh, W Springfield, MA (US)

(73) Assignee: ADC Telecommunications, Inc., Eden Prairie, MN (US)

(21) Appl. No.: 12/806,400

(22) Filed: Aug. 11, 2010
(Under 37 CFR 1.47)

Related U.S. Patent Documents

Reissue of:
(64) Patent No.: 6,428,362
Issued: Aug. 6, 2002
Appl. No.: 09/587,939
Filed: Jun. 6, 2000

U.S. Applications:
(63) Continuation of application No. 12/655,065, filed on Dec. 21, 2009, now abandoned, which is a continuation of application No. 11/732,104, filed on Apr. 2, 2007, now Pat. No. Re. 41,052, which is a continuation of application No. 11/253,281, filed on Oct. 17, 2005, now Pat. No. Re. 39,546, which is a continuation of application No. 09/378,105, filed on Aug. 20, 1999, now Pat. No. 6,089,923.

(51) Int. Cl.
*H01R 24/00* (2006.01)

(52) U.S. Cl. ..... 439/676; 439/941; 333/1

(58) Field of Classification Search ..... 439/676, 439/941, 76.1; 333/1
See application file for complete search history.

(56) References Cited

U.S. PATENT DOCUMENTS

| | | | |
|---|---|---|---|
| 2,943,272 | A | 6/1960 | Feldman |
| 3,757,028 | A | 9/1973 | Schlessel |
| 3,849,600 | A | 11/1974 | Ohshima |
| 3,891,815 | A | 6/1975 | Hiele |
| 3,946,165 | A | 3/1976 | Cooper |
| 4,274,691 | A | 6/1981 | Abernethy et al. |
| 4,406,509 | A | 9/1983 | Jagen |
| 4,698,025 | A | 10/1987 | Silbernagel et al. |
| 4,767,338 | A | 8/1988 | Dennis et al. |
| 4,831,497 | A | 5/1989 | Webster et al. |

(Continued)

FOREIGN PATENT DOCUMENTS

| | | |
|---|---|---|
| GB | 1382013 | 1/1975 |

(Continued)

OTHER PUBLICATIONS

Notification of Transmittal of the International Preliminary Examination Report, 18 pages, dated Nov. 28, 2001.

(Continued)

*Primary Examiner* — Tho D Ta
(74) *Attorney, Agent, or Firm* — Merchant & Gould P.C.

(57) ABSTRACT

A forward-reverse crosstalk compensation method is provided for compensating capacitance/inductance on a printed circuit board of a connector. The method includes a forward compensation process and a reverse compensation process. The forward compensation process compensates the unbalanced capacitance in the plug of the connector by using the parallel conductive lines or wires. The reverse compensation process can be used to compensate the unbalance capacitance/inductance caused by the forward compensations in the same pair combination of the connector. In both forward compensation and reverse compensation processes, electromagnetic fields, such as capacitors, can be formed to balance the capacitance/inductance on the printed circuit board of the connector.

15 Claims, 7 Drawing Sheets

U.S. PATENT DOCUMENTS

| | | | |
|---|---|---|---|
| 5,030,123 | A | 7/1991 | Silver |
| 5,071,371 | A | 12/1991 | Harwath et al. |
| 5,091,826 | A | 2/1992 | Arnett et al. |
| 5,156,554 | A | 10/1992 | Rudoy et al. |
| 5,178,554 | A | 1/1993 | Siemon et al. |
| 5,186,647 | A | 2/1993 | Denkmann et al. |
| 5,238,426 | A | 8/1993 | Arnett |
| 5,269,708 | A | 12/1993 | DeYoung et al. |
| 5,299,956 | A | 4/1994 | Brownell et al. |
| 5,310,363 | A | 5/1994 | Brownell et al. |
| 5,326,284 | A | 7/1994 | Bohbot et al. |
| 5,362,254 | A | 11/1994 | Siemon et al. |
| 5,362,257 | A | 11/1994 | Neal et al. |
| 5,399,107 | A | 3/1995 | Gentry et al. |
| 5,414,393 | A | 5/1995 | Rose et al. |
| 5,432,484 | A | 7/1995 | Klas et al. |
| 5,454,738 | A | 10/1995 | Lim et al. |
| 5,459,643 | A | 10/1995 | Siemon et al. |
| 5,474,474 | A | 12/1995 | Siemon et al. |
| 5,488,201 | A | 1/1996 | Liu |
| 5,547,405 | A | 8/1996 | Pinney et al. |
| 5,562,479 | A | 10/1996 | Pallas et al. |
| 5,580,257 | A | 12/1996 | Harwath |
| 5,580,270 | A | 12/1996 | Pantland et al. |
| 5,586,914 | A | 12/1996 | Foster, Jr. et al. |
| 5,626,497 | A | 5/1997 | Bouchan et al. |
| 5,628,647 | A | 5/1997 | Rohrbaugh et al. |
| 5,639,266 | A | 6/1997 | Patel |
| 5,663,870 | A | 9/1997 | Kerndlmaier |
| 5,673,009 | A | 9/1997 | Klas et al. |
| 5,674,093 | A | 10/1997 | Vaden |
| 5,679,027 | A | 10/1997 | Smith |
| 5,700,167 | A | 12/1997 | Pharney et al. |
| 5,713,764 | A | 2/1998 | Brunker et al. |
| 5,716,237 | A | 2/1998 | Conorich et al. |
| 5,735,714 | A | 4/1998 | Orlando et al. |
| 5,759,070 | A | 6/1998 | Belopolsky |
| 5,779,503 | A | 7/1998 | Tremblay et al. |
| 5,791,943 | A | 8/1998 | Lo et al. |
| 5,797,764 | A | 8/1998 | Coulombe et al. |
| 5,864,089 | A | 1/1999 | Rainal |
| 5,911,602 | A | 6/1999 | Vaden |
| 5,913,702 | A | 6/1999 | Garcin |
| 5,931,703 | A | 8/1999 | Aekins |
| 5,938,479 | A | 8/1999 | Paulson et al. |
| 5,940,959 | A | 8/1999 | Caveney et al. |
| 5,941,734 | A | 8/1999 | Ikeda et al. |
| 5,967,853 | A | 10/1999 | Hashim |
| 5,997,358 | A | 12/1999 | Adriaenssens et al. |
| 6,007,368 | A | 12/1999 | Lorenz et al. |
| 6,023,200 | A | 2/2000 | Rhee |
| 6,057,512 | A | 5/2000 | Noda et al. |
| 6,057,743 | A | 5/2000 | Aekins |
| 6,065,994 | A | 5/2000 | Hashim et al. |
| 6,086,428 | A | 7/2000 | Pharney et al. |
| 6,116,964 | A | 9/2000 | Goodrich et al. |
| 6,186,834 | B1 | 2/2001 | Arnett et al. |
| RE39,546 | E | 4/2007 | Phommachanh |
| RE41,052 | E * | 12/2009 | Phommachanh ..... 439/676 |

FOREIGN PATENT DOCUMENTS

| | | |
|---|---|---|
| GB | 1382013 | 1/1976 |
| GB | 2271678 A | 4/1994 |
| GB | 2273397 B | 1/1997 |
| GB | 2314466 A | 12/1997 |
| WO | WO 96/37017 | 11/1996 |

OTHER PUBLICATIONS

The Siemon Company Catalog pages—front cover page through p. 139, and back cover page, dated 1999.

The Siemon Company Catalog pages—front cover page through p. 1.39, and back cover page, dated 1999.

* cited by examiner

FIG. 15

| PAIR | PIN TERMINALS | TIP/RING | POLARITY |
|---|---|---|---|
| I | 5<br>4 | T<br>R | +<br>− |
| II | 3<br>6 | T<br>R | +<br>− |
| III | 1<br>2 | T<br>R | +<br>− |
| IV | 7<br>8 | T<br>R | +<br>− |

FIG. 16

| PAIR COMBINATIONS | CAPACITANCE BETWEEN PAIRS |
|---|---|
| I/II | C34, C35,<br>C65, C64 |
| I/III | C14, C15,<br>C24, C25 |
| I/IV | C47, C48,<br>C57, C58 |
| II/III | C13, C16,<br>C23, C26 |
| II/IV | C37, C38,<br>C67, C68 |
| III/IV | C17, C18,<br>C27, C28 |

JACK INCLUDING CROSSTALK COMPENSATION FOR PRINTED CIRCUIT BOARD

Matter enclosed in heavy brackets [ ] appears in the original patent but forms no part of this reissue specification; matter printed in italics indicates the additions made by reissue.

[This application] *Notice: More than one reissue application has been filed for the reissue of U.S. Pat. No. 6,428,362. The reissue patent applications include the present application, continuation of patent application Ser. No. 12/655,065, filed Dec. 21, 2009, now abandoned, continuation of patent application Ser. No. 11/732,104, filed Apr. 2, 2007, now Pat. No. RE41,052, and continuation of patent application Ser. No. 11/253,281, filed Oct. 17, 2005, now Pat. No. RE39,546. The present application is a continuation of patent application Ser. No. 12/655,065; which is a continuation of patent application Ser. No. 11/732,104; which is a continuation of patent application Ser. No. 11/253,281. U.S. Pat. No. 6,428,362* is a continuation of application Ser. No. 09/378,105, filed Aug. 20, 1999 now Pat. No. 6,089,923 [which application(s)]. *The above noted applications* are incorporated herein by reference.

FIELD OF THE INVENTION

The present invention relates to electrical connectors, and specifically to electrical connectors having closely spaced contacts and printed circuit boards where interference from crosstalk in the connector is a concern.

BACKGROUND OF THE INVENTION

Various electrical connectors are known for use in the telecommunications industry to transmit voice, data, and video signals. It is common for some electrical connectors to be configured to include a plug which is connectable to a jack mounted in the wall, or as part of a panel or other telecommunications equipment mounted to a rack or cabinet. The jack includes a housing which holds a plurality of closely spaced contact springs in the appropriate position for contacting the contacts of a plug inserted into the jack. The contact springs of the jack are often mounted to a printed circuit board, either vertically or horizontally. An RJ45 plug and jack connector system is one well known standard including closely spaced contacts.

Crosstalk between the contacts and circuit pathways in telecommunications connectors is a concern. U.S. Pat. Nos. 5,299,956 and 5,700,167 are examples of various connectors including jacks and plugs which attempt to address the problem of crosstalk in the circuit board. It is desired to improve performance of the electrical connectors, such as an RJ45 connector, where crosstalk problems increase as higher frequencies are transmitted through the connector.

Most of the crosstalk problems occurring in a connector, such as an RJ45 connector, is mainly caused by the plug. This crosstalk is produced by the non-periodic or random discharges of crosstalk energy due to the imbalanced capacitance and/or inductance in the plug and the contact springs of a jack. RJ45 types of connectors are mainly used with balanced twisted pairs of conductors or wires. There is no grounding to shield the crosstalk energy.

One of the known techniques commonly used to solve the crosstalk problem in a connector is to balance the capacitance on the printed circuit board or on a substrate of the connector to minimize or eliminate the leaking energies from the unbalanced capacitance. The known method of reducing crosstalk generally includes forming of a capacitor by using two parallel conductive lines or wires and inducing electro-magnetic field to compensate the lesser field produced by the capacitive imbalance in the plug. This method is often referred to as capacitance balancing or capacitive compensation. The known compensation technique is applied at the nearest unbalanced components, which are the contact springs of a jack and the mated RJ45 plug. This technique is very useful for the TIA/EIA category 5 and Enhanced category 5 (5E) connector. However, the crosstalk performance of these connectors is rated only up to 100 MHz. Higher frequencies are in demand in the telecommunication and data transmission industry. The TIA/EIA category 6 connector standards have been proposed to meet the demand. Under the proposed category 6 standards, the connector is required to meet the crosstalk specifications up to 250 MHz, which is about 150% more bandwidth than the category 5's.

In order to meet this specifications, additional compensations or additional parallel conductive lines are needed to be placed on the circuit board at the nearest unbalanced components. It has been found that capacitive compensation only worsens the directivity or equal-level of the far-end crosstalk (FEXT) of the connector because the capacitor formed by two conductive lines has an inductive effect which is not accountable for. Also, it has been found that the additional compensation has a reverse capacitive effect on the near-end crosstalk (NEXT) of the connector. Generally, the far end and the near end are defined according to the two ends of the printed circuit board. The end to which signals are being injected is the near end. The opposite is the far end.

In addition, the natural crosstalk characteristic for short transmission lines, i.e. −20 dB per frequency decade, will be lost if the connector is heavily compensated. This natural crosstalk characteristic is generally required to be maintained in order for a connector to meet the category 6 crosstalk specifications.

Accordingly, the known compensation technique is either insufficient to compensate the crosstalk, or problematic by overcompensating for the crosstalk. The known compensation technique has been considered ineffective when applied to the development of a category 6 or a category 6 type of connector, and particularly, it is unable to meet the crosstalk specifications up to 250 MHz.

Thus, there is a need for a connector including an improved crosstalk compensation technique for a printed circuit board. Further, there is a need for a connector with balanced capacitance and/or inductance on the printed circuit board to minimize or eliminate crosstalk in the connector.

SUMMARY OF THE INVENTION

The present invention provides a method of compensating crosstalk for a printed circuit board of a connector. The present invention also provides a connector including such crosstalk compensation method.

The present method of compensating crosstalk for a printed circuit board includes a forward compensation process and a reverse compensation process. The forward compensation process compensates capacitively for the unbalanced capacitance in the plug by forming capacitors, for example, using the parallel conductive lines or wires on the printed circuit board. The reverse compensation process can be used to compensate the unbalanced capacitance and inductance caused by the forward compensations in the same pair combination of the connector. In other words, the reverse compensation negates the forward compensation at the far-end of the printed circuit board by forming capacitors, for example, using the parallel conductive lines or wires, at the far-end of the printed circuit board.

In one aspect of the present invention, the method of compensating crosstalk in a connector arrangement includes: providing a plurality of pairs of conductors on a printed circuit board, the pairs of conductors connecting to respective front and rear terminals, each pair of conductors including a ring conductor and a tip conductor, and the ring and tip conductors being substantially disposed in parallel to control the transmission line impedence; sending electrical signals between the front and rear terminals; generating forward-compensating capacitance, induced between two of the pairs of conductors, proximate the respective front terminals by providing a first capacitor between a first conductor of the first pair and a second conductor of the second pair and providing a second capacitor between a second conductor of the first pair and a first conductor of the second pair; and generating reverse-compensating capacitance/inductance to compensate the unbalanced capacitance/inductance induced between the two pairs of conductors by the first and second capacitors at the front terminal. The reverse-compensating capacitance/inductance is disposed proximate the rear terminals by providing a third capacitor between the first conductor of the first pair and the first conductor of the second pair and providing a fourth capacitor between the second conductor of the first pair and the second conductor of the second pair.

Accordingly, unbalanced capacitance/inductance, induced between the two pairs of conductors on the printed circuit board is compensated by the first, second, third, and fourth capacitors.

In one aspect of the present invention, the capacitance/inductance of the same two pairs of conductors is compensated at the opposite terminals in the reverse compensation process.

In another aspect of the present invention, the forward-reverse compensation technique can also be applied to minimize or eliminate crosstalk induced between any other combinations of two pairs of conductors on the printed circuit board.

One of the advantages of the forward-reverse compensation technique is that by reversing the compensations of ones at the opposite terminals, both the far-end crosstalk performance and the near-end crosstalk performance are improved. The inductance effect resulted from forming the capacitors at the front terminals of the printed circuit board of the connector is also balanced.

These and various other features as well as advantages that characterize the present invention will be apparent upon reading of the following detailed description and review of the associated drawings.

BRIEF DESCRIPTION OF THE DRAWINGS

The accompanying drawings, which are incorporated in and constitute a part of this specification, illustrate several aspects of the invention and together with the description, serve to explain the principles of the invention. A brief description of the drawings is as follows:

FIG. 15 is a table showing tip/ring pair connections and polarities applied to the ends or terminals of the tip/ring connections on the circuit board;

FIG. 16 is a table showing pair combinations and capacitance between the pairs of each pair combination;

DETAILED DESCRIPTION

Figure 1:
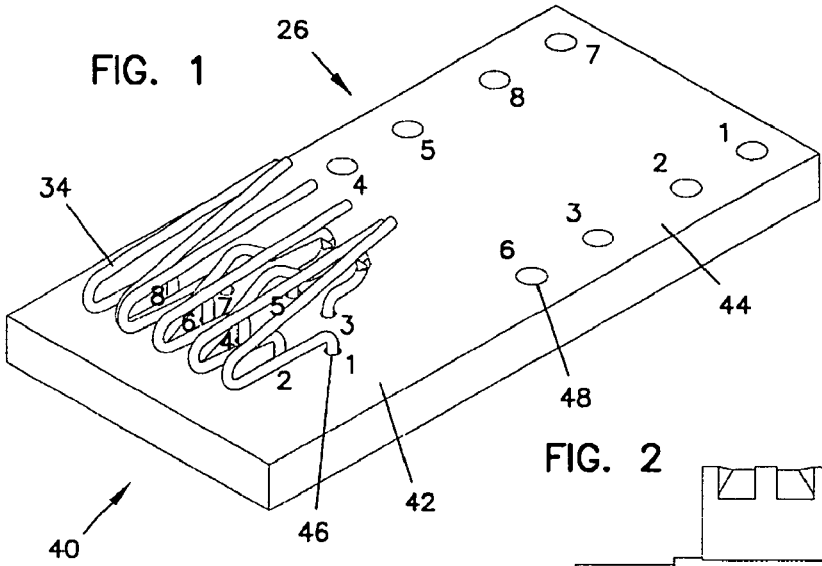
FIG. 1 is a perspective view of a printed circuit board of one embodiment of the present invention for a telecommunications jack including contact springs at a front portion, and cable terminals at a rear portion.
Figure 2:
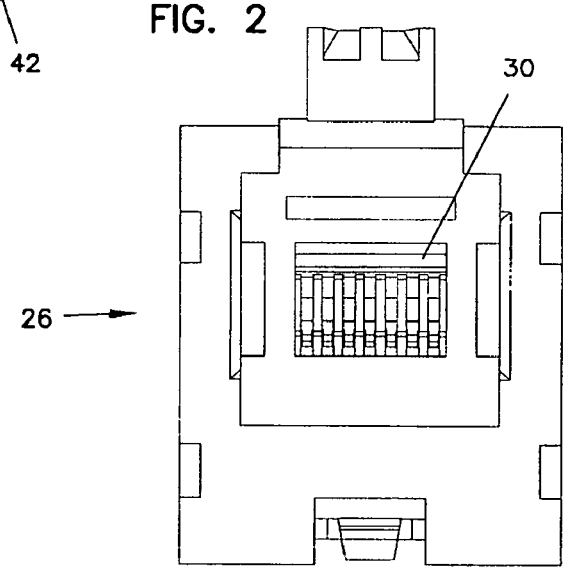
FIG. 2 is a front end view of a modular jack including the circuit board of FIG. 1.

Reference will now be made in detail to exemplary aspects of the present invention that are illustrated in the accompanying drawings. Wherever possible, the same reference numbers will be used throughout the drawings to refer to the same or like parts.

FIGS. 1-4 show an example of a jack 26 constructed in accordance with the principles of the present invention. In the example shown, jack 32 defines a modular jack construction for mounting to a wall plate, panel or other mounting structure. Jack 26 defines a port 30 for receiving a plug 32. A plurality of contact springs 34 are positioned within port 30 to engage one of a plurality of contacts 36 in the plug 32. The plug 32 includes a resilient latch 33. When the plug 36 is inserted into the port 30, the latch 33 interlocks with a front tab 35 of the jack 26 to retain the plug 32 within the port 30. To remove the plug 32, the latch 33 is depressed thereby allowing the plug 32 to be pulled from the port 30.

As shown in the illustrated preferred embodiment, the jack 26 and plug 32 is an 8 contact type (i.e., 4 twisted pair) connector arrangement. While the various aspects of the present invention are particularly useful for 8 contact modular connectors, it will be appreciated that other types of connectors could also be used.

Referring also to FIGS. 5-14, the jack 26 includes a printed circuit board 40 which includes a front portion 42, and a rear portion 44. The front portion 42 includes a plurality of front terminals 46 labeled 1-8. The contact springs 34 extend from the circuit board 40 at the front terminals 46 to engage the contacts 36 of the plug 32. The rear portion 44 of the circuit board 40 includes a plurality of rear terminals 48 labeled 1-8. The rear terminals 48 are connectable to cables such as through insulation displacement contacts (IDC) 49. Between the front and rear terminals 46, 48 on circuit board 40 are circuit lines or pathways 50. As will be described in greater detail below, additional circuit pathways 52 are provided to compensate for crosstalk.

The jack 26 includes a front jack housing 54, and a rear insert assembly 56 in the illustrated preferred embodiment. The jack housing 54 is adapted to be snap-fit into a face plate, panel, or other mounting arrangement.

The insert assembly 56 is adapted to snap fit within a back side 61 of the housing 54. The insert assembly 56 includes a connector mount 66, a plurality of insulation displacement terminals 68, a termination cap 70, the circuit board 40, and the contact springs 34 (e.g., eight contact springs) mounted on the circuit board 40. When assembled, the insulation displacement terminals 68 and the termination cap 70 mount at a top side of the connector mount 66, while the circuit board 40 mounts to a bottom side of the connector mount 66. As so assembled, the contact springs 34 project upward between resilient locking tabs 76 (only one shown) of the connector mount 66. The locking tabs 76 are adapted to snap fit within corresponding openings 78 defined by the housing 54. Further detail relating to an exemplary housing and connector mount suitable for practicing the present invention are disclosed in U.S. patent application Ser. No. 09/327,053, filed Jun. 7, 1999 that is hereby incorporated by reference. Details relating to contact spring configurations suitable for use with the present invention are disclosed in U.S. patent application Ser. No. 09/378,404, which is entitled Telecommunications Connector for High Frequency Transmissions, which was filed on a date concurrent with the filing date of this application, and which is hereby incorporated by reference. Other spring configurations are possible, such as those shown in U.S. patent application Ser. No. 09/231,736, filed Jan. 15, 1999 hereby incorporated by reference. Other spring configurations are possible for use with circuit board 40, as desired. Further, front terminals 46 are shown in 3 rows across board 40 in the preferred embodiment. Other arrangements are possible such as more or less rows.

Figure 3:
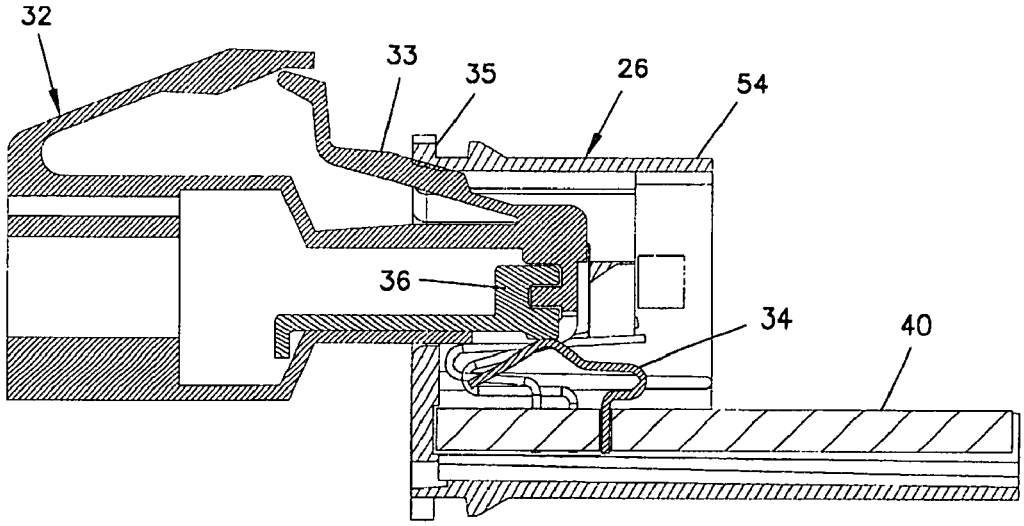
FIG. 3 is a cross-sectional side view of the jack of FIG. 2, and showing a plug mounted in the opening of the jack.
Figure 4:
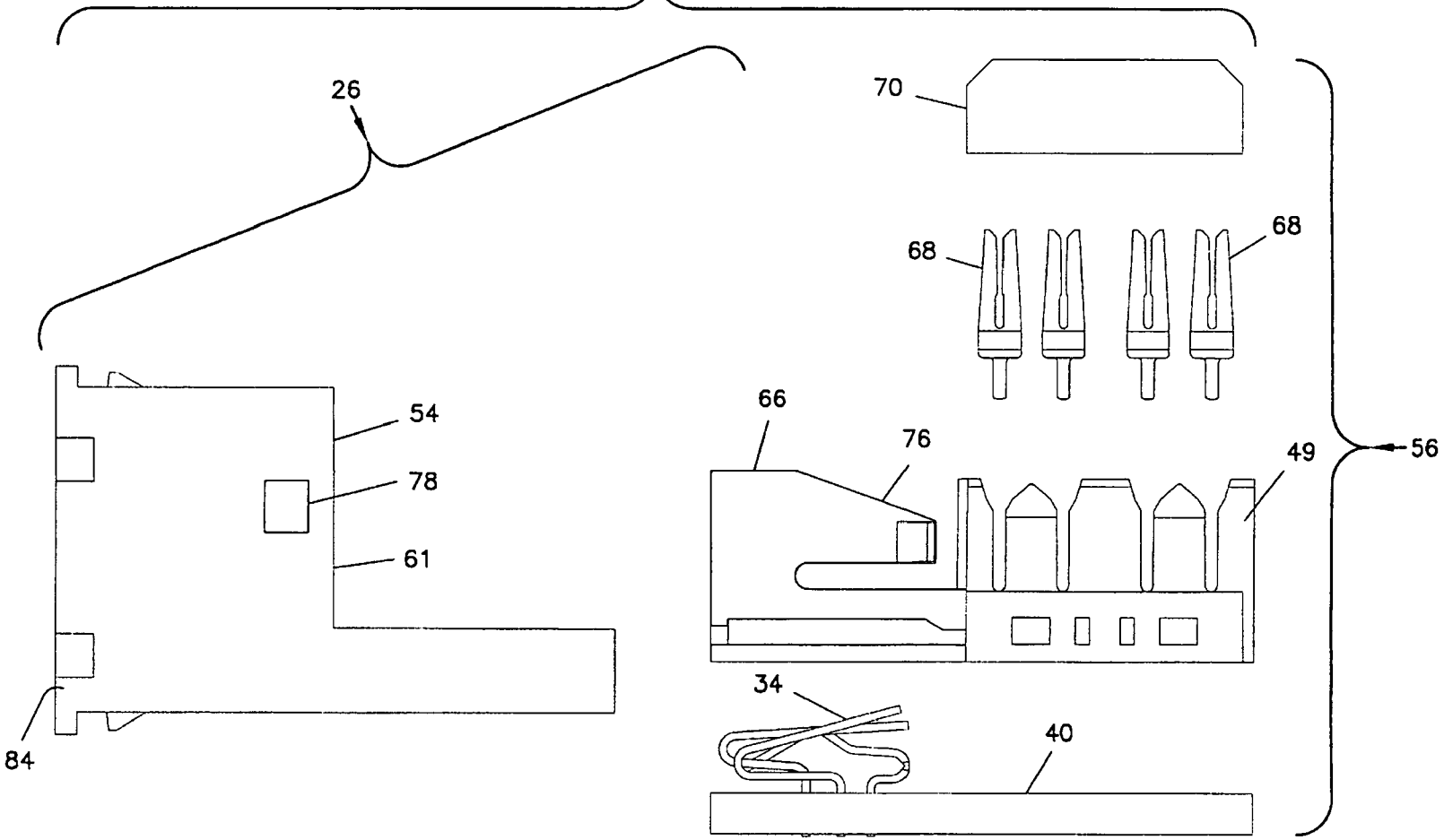
FIG. 4 is an exploded side view of the jack of FIG. 2.

FIG. 3 shows the modular plug 32 inserted within the port 30 defined by a front side 84 of the housing 54. The plug 32 includes eight contacts 36 that provide electrical connections with the contact springs 34 of the modular jack 26 when the plug 32 is inserted within the port 30. For example, FIG. 3 shows one of the contacts 36 in electrical contact with one of the contact springs 34. As shown in FIGS. 1, 3 and 4, the contact springs 34 are in a deflected orientation, such as that caused by the contacts 36 of plug 32. In the undeflected orientation, contact springs 34 have their free ends further spaced from board 40 than the illustrated deflected orientation.

Figure 5:
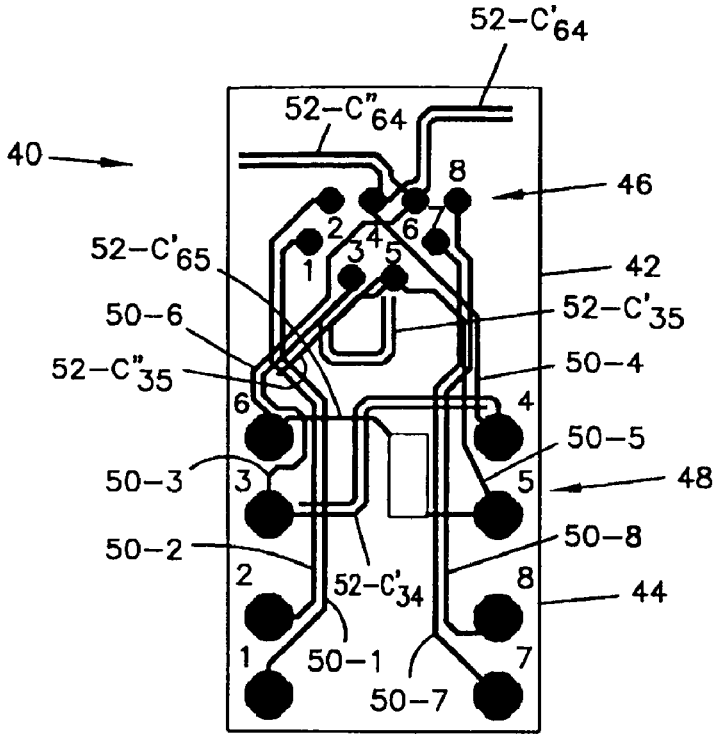
FIG. 5 is a top view of the circuit board of FIG. 1, with four layers, and showing certain circuit pathways of the four layers of the illustrated preferred embodiment, including the main signal pathways between the front portion and the rear portion of the board, and additional compensation circuit pathways.

In FIG. 5, the circuit board 40 preferably includes four layers shown in FIGS. 6-9, respectively. Circuit pathways between front terminals 46 labeled 1-8 at the front portion 42 and rear terminals 48 labeled 1-8 at the rear portion 44 are all shown in FIG. 5 for explanation purposes. FIGS. 6-9 illustrate a preferred layout of the circuit pathways in four layers, such that the crossover between the conductive lines or wires is on different layers. The illustrated layout of the pathways conforms with the industry standards. The front terminal or pin 46-1 is connected to the opposite rear terminal or pin 48-1 via a transmission path or conductor 50-1. Similarly, the other front terminals or pins 46-N are connected to the rear terminals or pins 48-N, respectively, via transmission paths 50-N.

In a typical terminal pin assignments, such as in a RJ45 connector, best shown in FIG. 15, transmission paths 50-4 and 50-5 form a pair I where transmission path 50-5 is a tip line, and transmission path 50-4 is a ring line; transmission path 50-3 and 50-6 form a pair II where transmission path 50-3 is a tip line, and transmission path 50-6 is a ring line; transmission paths 50-1 and 50-2 form a pair III where transmission path 50-1 is a tip line, and transmission path 50-2 is a ring line; and transmission paths 50-7 and 50-8 form a pair IV where transmission path 50-7 is a ring line, and transmission path 50-8 is a ring line. The tip terminal generally has a positive polarity, and the ring terminal generally has a negative polarity. It is appreciated that the pin assignments can be varied without departing from the principles of the present application. For example, transmission path 50-3 and 50-6 can be referred to as pair III, and transmission path 50-1 and 50-2 can be referred to as pair II.

In FIG. 5, the transmission paths of each pair are substantially parallel to each other. As shown, the transmission paths 50-4 and 50-5 are parallel; the transmission paths 50-3 and 50-6 are parallel; the transmission paths 50-1 and 50-2 are parallel; the transmission paths 50-7 and 50-8 are parallel. These are the main signal pathways between the front portion 42 and the rear portion 44 of the circuit board 40.

Figure 17:
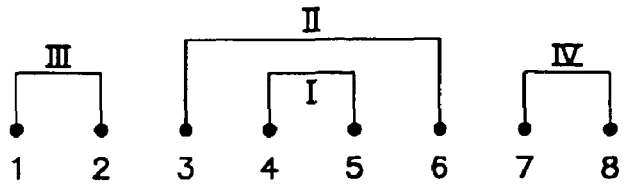
FIG. 17 is an illustration of an example of pin configurations of a typical connector, for example, a RJ45 connector.

In addition, in FIG. 5, compensation conductive lines 52 are added and disposed in parallel to form capacitors 52-C. The added capacitors compensate the unbalanced capacitance carried from the plug to the front portion 42 of the circuit board 40. In FIG. 16, a table of capacitance between each two pairs of transmission paths are shown. By way of an example, between pairs I and II, there are four capacitance, C34, C35, C65, C64. As illustrated in FIG. 17, due to the distance and/or location of the contacts in the plug, C34 is larger than C35, and C65 is larger than C64. Thus, the capacitance is unbalanced between C34 and C35 in the I/II pairs. Also, the capacitance is unbalanced between C65 and C64 in the I/II pairs.

Figure 18:
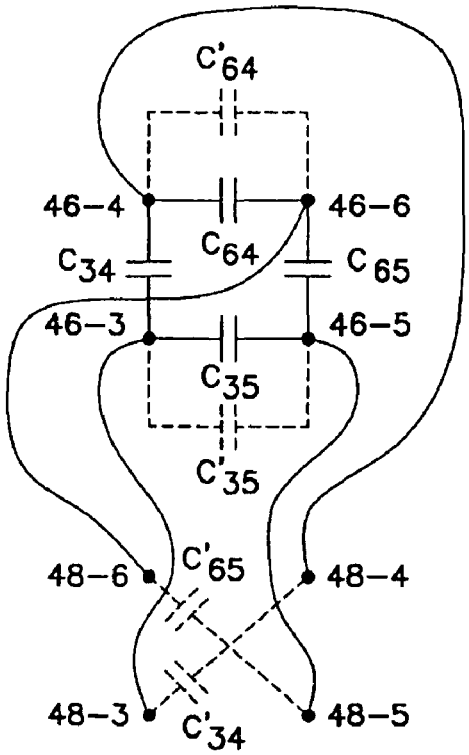
FIG. 18 is an illustration of capacitance between pairs I and II carried from the plug and compensating capacitance between pairs I and II at both front and rear terminals.

The forward compensation is illustrated in FIG. 18. At the front portion 42 of the connector, a capacitor C35' is added in dashed lines between terminals 46-3 and 46-5, such that the capacitance between terminals 46-3 and 46-4 and the capacitance between terminals 46-3 and 46-5 are balanced.

Similarly, in FIG. 18, a capacitor C64' is added in dashed lines between terminals 46-4 and 46-6, such that the capacitance between terminals 46-4 and 46-6 and the capacitance between terminals 46-5 and 46-6 are balanced.

Figure 19:
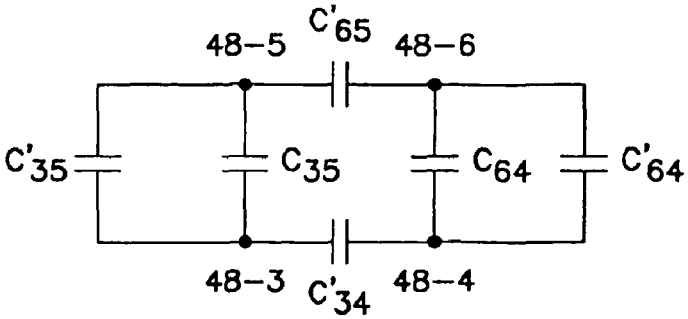
FIG. 19 is an illustration of capacitance between pairs I and II at the front terminals and compensating capacitance between pairs I and II at the rear terminals.

As shown in FIG. 18, at the rear portion 44, the capacitance is generally minimal due to the isolation provided by the isolation displacement contacts (IDCs) 49 (FIG. 4). However, the addition of the capacitors C35' and C64' causes capacitance/inductance unbalance on the printed circuit board between the front and rear portions. To compensate for such induced unbalance of the capacitance on the printed circuit board, a capacitor C65' is further added in dashed lines between rear terminal 48-5 and rear terminal 48-6; and a capacitor C34' is further added in dashed lines between rear terminal 48-3 and rear terminal 48-4, as shown in FIG. 19. Accordingly, the capacitance/inductance with respect to pairs I and II between the front and rear portions of the printed circuit board is balanced. In other words, C65' and C34' reverse-compensate the capacitance/inductance unbalance caused by the addition of C35' and C64'.

As shown in FIG. 5, the forward compensation is performed at the front portion 42. The capacitor C35' between terminal 46-3 and terminal 46-5 is formed by two parallel conductive lines 52-C35'. The capacitor C64' between terminal 46-6 and terminal 46-4 is formed by two parallel conductive lines 52-C64'. Additional capacitors, such as 52-C64" and 52-C35", can be used if desired to increase or adjust the capacitance at the front portion 42.

Also as shown in FIG. 5, the reverse compensation is performed at the rear portion 44. The capacitor C65' between terminal 48-6 and terminal 48-5 is formed by two parallel conductive lines 52-C65'. The capacitor C34' between terminal 48-3 and terminal 48-4 is formed by two parallel conductive lines 52-C34'. It is appreciated that additional capacitors can be used if desired to balance the capacitance/inductance resulted from the front portion 42.

Figure 6:
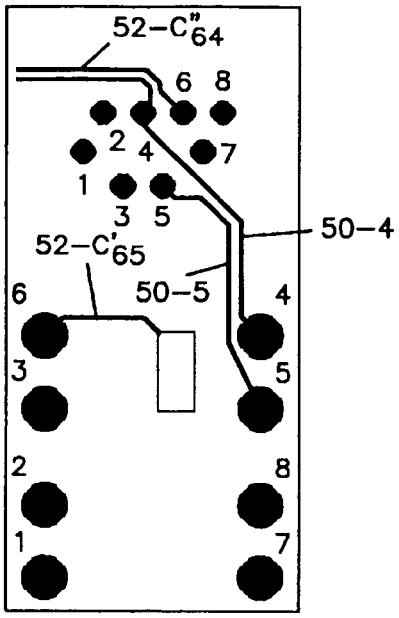
FIG. 6 is a top view of the first layer of the circuit board of FIG. 5.
Figure 7:
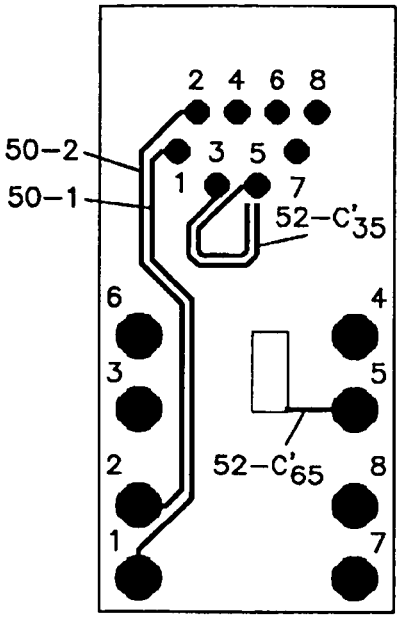
FIG. 7 is a top view of the second layer of the circuit board of FIG. 5.
Figure 8:
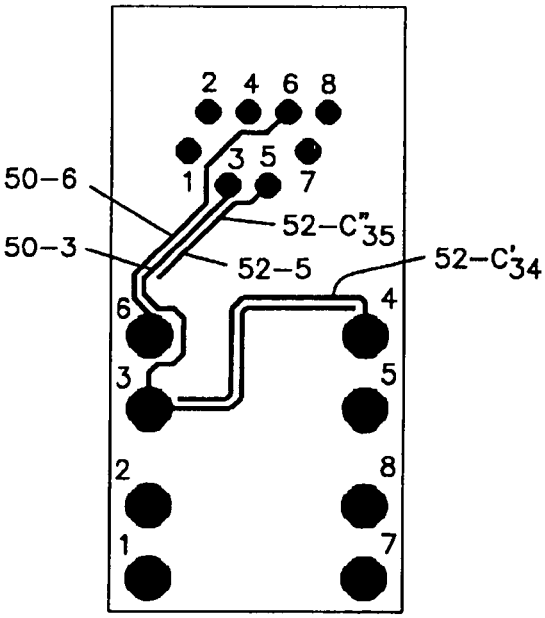
FIG. 8 is a top view of the third layer of the circuit board of FIG. 5.

The compensating conductive lines 52 are terminated on the isolation displacement contacts with a preferable 100 Ohm resistor as generally specified in the industry. It is appreciated that other resistance can be used at the terminal within the scope of the present invention. Further, the shape or type of compensating capacitors can be varied. For example, C64', C35', C34', C64", and C35" are capacitors formed on the same layer as shown in FIGS. 6-9. As shown in FIGS. 6-7, C65' is formed on two different layers. Also, as shown in FIG. 8, C35" is formed between transmission path 50-3 and an additional compensating conductive line 52-5. It is appreciated that other forms of an electromagnetic field besides capacitors can be used within the scope of the present invention.

Figure 9:
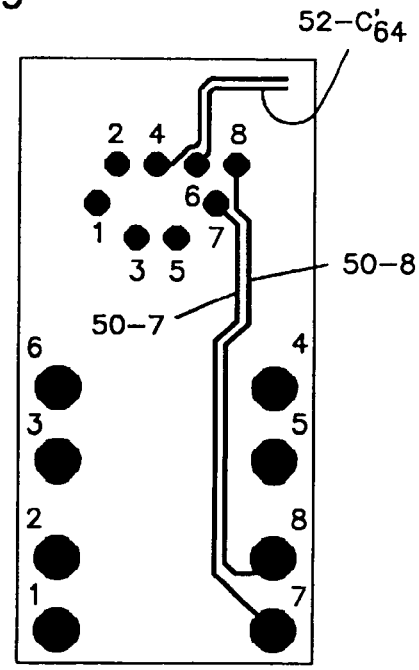
FIG. 9 is a top view of the fourth layer of the circuit board of FIG. 5.

In a preferred printed circuit board arrangement, the layer shown in FIG. 6 is the first layer of the circuit board 40, the layer shown in FIG. 7 is the second layer of the circuit board 40, the layer shown in FIG. 8 is the third layer of the circuit board 40, and the layer shown in FIG. 9 is the fourth layer of the circuit board 40. It is appreciated that other printed circuit board arrangements can be used without departing from the principles of the present invention.

Accordingly, by reversing the compensations of ones at opposite terminals, i.e. at the rear portion 44, the forward-reverse compensation processes allow the capacitance/inductance induced between pair I and pair II to be balanced on the printed circuit board. As a result, crosstalk caused by the imbalanced capacitance/inductance of pair I and pair II is minimized or eliminated.

It is appreciated that the imbalance capacitance/inductance caused by the other pair combinations, such as the other five pair combinations shown in FIG. 16, i.e., I III, IIV, II/IV, and III/IV, can be minimized or eliminated by applying the same principle of the present invention. It is also noted that the imbalance capacitance/inductance caused by pairs III/IV may be negligible due to the far distance between the two pairs.

Figure 10:
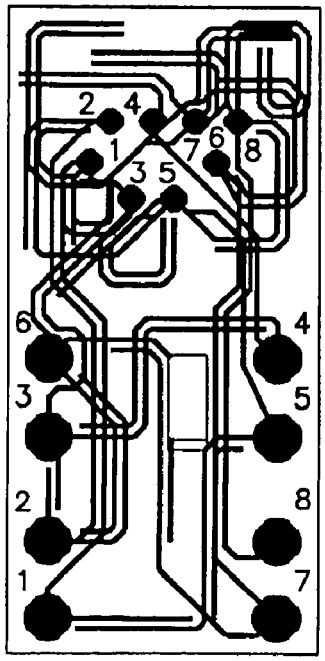
FIG. 10 is a more complete top view of the circuit board of FIG. 5 showing more of the circuit pathways in the preferred embodiment.
Figure 11:
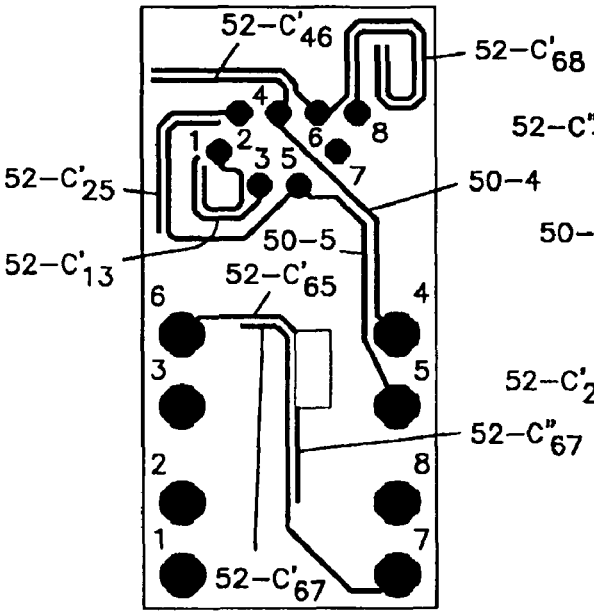
FIG. 11 is a top view of the first layer of the circuit board of FIG. 10.

FIG. 10 illustrates a top view of a more complete capacitance/inductance compensation arrangement on the printed circuit board 40 in a preferred embodiment. It is more complete in a sense that capacitance/inductance imbalance from the other pair combinations (except the combination of pair III and pair IV) are considered. Accordingly, additional capacitors, such as 52-C13', can be used to minimize or eliminate the capacitance imbalance induced by pair II and pair III. In FIG. 11, the capacitor C13' is formed by a conductive line 52-C13' between the terminal 46-1 and the terminal 46-3. In each case, once a capacitor is added to compensate the capacitance imbalance at the front portion 42, another capacitor, for example, 52-C23', is added to compensate the capacitance/inductance imbalance at the rear portion 44.

Figure 12:
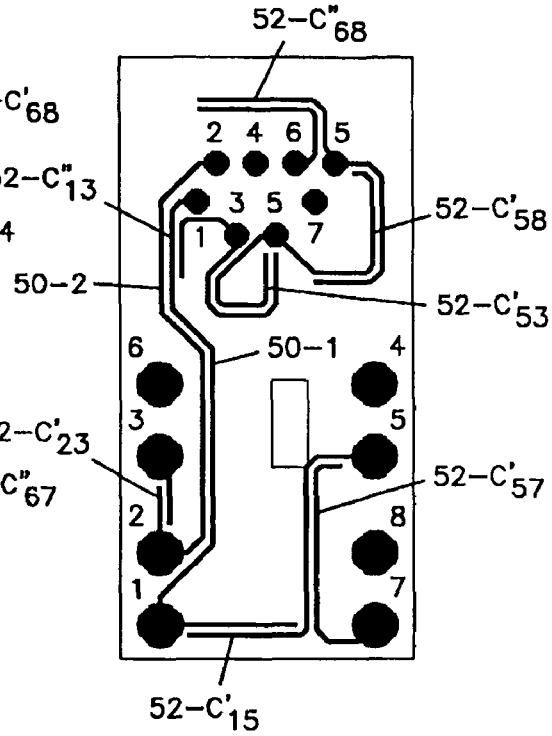
FIG. 12 is a top view of the second layer of the circuit board of FIG. 10.
Figure 13:
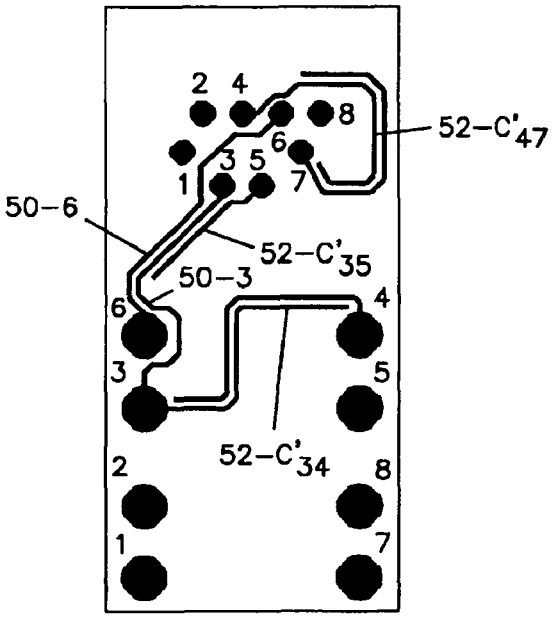
FIG. 13 is a top view of the third layer of the circuit board of FIG. 10.
Figure 14:
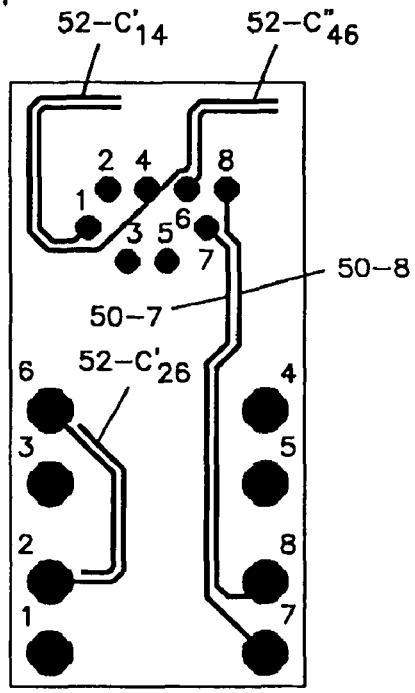
FIG. 14 is a top view of the fourth layer of the circuit board of FIG. 10.

The capacitors for pair combinations (except pair combination III/IV) are 52-C46', 52-C68', 52-C25', 52-C65', 52-C67', and 52-C67" as shown in FIG. 11; 52-C68", 52-C58', 52-C13", 52-C53', 52-C57', 52-C23', and 52-C15' as shown in FIG. 12; 52-C47', 52-C35', and 52-C34' as shown in FIG. 13; 52-C46", 52-C14', and 52-C26' as shown in FIG. 14. It is appreciated the layout of the resistors can be changed between the layers without departing the scope of the present invention. It is noted that when the space on one layer for a compensating capacitor, for example 52-C67', is not sufficient, additional compensating capacitor 52-C67" is formed in a different layer.

In a preferred embodiment, the layer shown in FIG. 11 is the first layer of the circuit board of FIG. 10. The layer shown in FIG. 12 is the second layer of the circuit board of FIG. 10. The layer shown in FIG. 13 is the third layer of the circuit board of FIG. 10. The layer shown in FIG. 14 is the fourth layer of the circuit board of FIG. 10. It is appreciated that other circuit layer arrangements in the connector can be used within the scope of the present invention.

It will be appreciated that the forward-reverse compensating technique can also be used to compensate unbalanced inductance in the plug and/or contact springs by forming additional capacitors in the reverse compensation process.

It will also be appreciated that other types of electromagnetic field can be used to compensate unbalanced capacitance/inductance on the printed circuit board. For example, the electro-magnetic field can be a combination of capacitor and an inductor.

It is further appreciated that the capacitors and/or inductors used in the forward-reverse compensation technique can be implemented in other parts of the connector, i.e. not necessarily on the printed circuit board, without departing from the principles of the present invention.

The forward-reverse crosstalk compensation technique of the present invention significantly improves the near-end as well as the far-end crosstalk performance. For example, the near-end crosstalk can be as low as −64 dB at 100 MHz frequency and as low as −48 at 250 MHz frequency. The far-end crosstalk can be as low as −52 dB at 100 MHz frequency and as low as −44 dB at 250 MHz.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

[1. A method of compensating cross-talk in a connector arrangement which includes a plug and a circuit board, comprising:

forward compensating unbalanced capacitance in the plug; and reverse compensating unbalanced capacitance and inductance caused by the forward compensation.]

[2. The method of claim 1, wherein the forward compensating includes forming a capacitor by using additional parallel conductive lines on the circuit board, and the reverse compensating includes forming a capacitor by using additional parallel lines on the circuit board.]

[3. A connector arrangement for compensating cross-talk, comprising:

a circuit board with front and rear terminals;

a plurality of pairs of conductors disposed on the circuit board, the pairs of conductors connecting to respective front and rear terminals, each pair of conductors including a ring conductor and a tip conductor, and the ring and tip conductors being substantially disposed in parallel;

a forward-compensating capacitance for compensating unbalanced capacitance, proximate the front terminals; and a reverse-compensating capacitance for compensating unbalanced capacitance and inductance caused by the forward-compensating capacitance, proximate the rear terminals.]

[4. The connector arrangement of claim 3, wherein the forward-compensating capacitance is formed by using additional parallel conductors on the circuit board, and the reverse-compensating capacitance is formed by using additional parallel conductors on the circuit board.]

[5. The connector arrangement of claim 3, wherein the front terminals include contact springs.]

[6. The connector arrangement of claim 3, wherein the rear terminals include insulation displacement connectors.]

[7. The connector arrangement of claim 3, further comprising a housing holding the circuit board, the housing defining a plug port for receipt of a plug of a telecommunications cable.]

[8. The connector arrangement of claim 3, wherein the plurality of pairs of conductors are disposed on one side of the circuit board.]

*9. A method of compensating cross-talk in a connector arrangement which includes a plug and a multi-layered circuit board with first and second sets of terminals, comprising:*

*forward compensating unbalanced capacitance in the plug; and*

*reverse compensating unbalanced capacitance and inductance caused by the forward compensation,*

*wherein the connector arrangement includes:*

*i) a first and a second pair of conductors on the circuit board, wherein each of the conductors interconnects respective terminals from the first and second sets of terminals, and wherein at least one pair has both conductors on the same layer of the multi-layered circuit board;*

*ii) first and second capacitors, wherein the first capacitor is formed between a first conductor of the first conductor pair and a second conductor of the second pair, and wherein the second capacitor is formed between a second conductor of the first pair and a first conductor of the second pair; and*

*iii) third and fourth capacitors, wherein the third capacitor is formed between the first conductor of the first pair and the first conductor of the second pair, and wherein the fourth capacitor is formed between the second conductor of the first pair and the second conductor of the second pair.*

*10. The method of claim 9, wherein the forward compensating includes forming a capacitor by using additional parallel conductive lines on the circuit board, and the reverse compensating includes forming a capacitor by using additional parallel lines on the circuit board.*

*11. The method of claim 9, wherein the first set of terminals is positioned on a front portion of the circuit board and the second set of terminals are positioned on a rear portion of the circuit board.*

*12. The method of claim 9, wherein the arrangement includes contact springs connected to the first set of terminals.*

*13. The method of claim 9, wherein the arrangement includes insulation displacement connectors connected to the second set of terminals.*

*14. The method of claim 9, wherein the conductors of each pair are substantially disposed in parallel.*

*15. The method of claim 9, wherein the first pair is the 3-6 conductor pair, and wherein the second pair is the 4-5 conductor pair.*

*16. The method of claim 9, wherein the first and second capacitors are located proximate the first set of terminals, and wherein the third and fourth capacitors are located proximate the second set of terminals.*

*17. The method of claim 9, wherein the multi-layered circuit board has four layers.*

*18. The method of claim 9, wherein the second set of terminals are arranged in pairs, each pair of terminals from the second set of terminals connected to one of said conductor pairs.*

*19. The method of claim 9, wherein the second set of terminals is arranged in two groups along opposite edges of the circuit board.*

*20. The method of claim 19, wherein the conductors of the at least one pair are substantially parallel.*

*21. The method of claim 19, wherein the terminals from at least one of the groups are unevenly spaced.*

*22. The method of claim 9, wherein at least one of the first, second, third and fourth capacitors is located on the same layer as the at least one pair of conductors.*

*23. The method of claim 22, wherein the at least one of the first, second, third and fourth capacitors is formed by using additional parallel conductive traces on the circuit board.*

* * * * *